US008659965B2

(12) United States Patent
Lee

(10) Patent No.: US 8,659,965 B2
(45) Date of Patent: Feb. 25, 2014

(54) SENSE AMPLIFIER HAVING LOOP GAIN CONTROL

(75) Inventor: Seong-Hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/619,763

(22) Filed: Sep. 14, 2012

(65) Prior Publication Data

US 2013/0009705 A1    Jan. 10, 2013

Related U.S. Application Data

(62) Division of application No. 12/694,136, filed on Jan. 26, 2010, now Pat. No. 8,289,796.

(51) Int. Cl.
*G11C 7/02* (2006.01)

(52) U.S. Cl.
USPC ...... 365/207; 365/206; 365/205; 365/189.05; 365/189.09; 365/189.11

(58) Field of Classification Search
USPC ............... 365/205, 207, 206, 189.05, 189.09, 365/189.11
See application file for complete search history.

(56) References Cited

U.S. PATENT DOCUMENTS

| 4,284,957 | A | 8/1981 | Haque |
| 4,502,020 | A | 2/1985 | Nelson et al. |
| 4,555,673 | A | 11/1985 | Huijsing et al. |
| 4,586,166 | A | 4/1986 | Shah |
| 4,792,923 | A | 12/1988 | Nakase et al. |
| 4,837,523 | A * | 6/1989 | Wright .......................... 330/255 |
| 4,843,343 | A | 6/1989 | Pace |
| 5,473,567 | A | 12/1995 | McClure |
| 5,477,497 | A | 12/1995 | Park et al. |
| 5,489,874 | A * | 2/1996 | Tanoi ............................ 327/560 |
| 5,493,533 | A | 2/1996 | Lambrache |
| 5,504,442 | A * | 4/1996 | Tanoi ............................ 327/51 |
| 5,514,986 | A * | 5/1996 | Tanoi ............................ 327/57 |
| 5,654,928 | A | 8/1997 | Lee et al. |
| 5,710,739 | A | 1/1998 | Calligaro et al. |
| 5,815,451 | A | 9/1998 | Tsuchida |
| 5,949,730 | A | 9/1999 | Shirley et al. |
| 6,127,853 | A | 10/2000 | Yu |
| 6,141,246 | A | 10/2000 | Derman et al. |
| 6,191,989 | B1 | 2/2001 | Luk et al. |
| 6,271,977 | B1 * | 8/2001 | Chung et al. .................... 360/46 |
| 6,292,417 | B1 | 9/2001 | Seyyedy |
| 6,326,815 | B1 | 12/2001 | Sim et al. |
| 6,396,310 | B2 | 5/2002 | Shin |
| 6,456,161 | B2 * | 9/2002 | Smith ............................ 330/252 |
| 6,466,499 | B1 | 10/2002 | Blodgett |
| 6,483,351 | B2 | 11/2002 | Sim |
| 6,483,353 | B2 | 11/2002 | Kim et al. |
| 6,617,885 | B2 | 9/2003 | Lim et al. |
| 6,721,218 | B2 | 4/2004 | Lim |
| 6,738,302 | B1 | 5/2004 | Parris et al. |
| 6,750,714 | B1 * | 6/2004 | McIntyre ....................... 330/255 |

(Continued)

*Primary Examiner* — Viet Q Nguyen
(74) *Attorney, Agent, or Firm* — Dorsey & Whitney LLP

(57) ABSTRACT

Memories, sense amplifiers, and methods for amplifying a current input are disclosed, including a sense amplifier including a bias circuit configured to provide a bias voltage having a magnitude responsive to maintaining a substantially constant loop gain, and further including an amplifier stage coupled to the bias circuit to receive the bias voltage and configured to amplify a input current at an input-output node, a loop gain of the current amplifier stage is controlled at least in part to the bias voltage.

13 Claims, 5 Drawing Sheets

(56) References Cited

U.S. PATENT DOCUMENTS

| | | | |
|---|---|---|---|
| 6,798,250 B1 * | 9/2004 | Wile | 327/51 |
| 6,831,503 B2 | 12/2004 | La Rosa | |
| 6,870,425 B2 * | 3/2005 | Leifso et al. | 330/254 |
| 6,879,217 B2 | 4/2005 | Visocchi | |
| 6,879,533 B2 | 4/2005 | Chae et al. | |
| 6,894,564 B1 | 5/2005 | Gilbert | |
| 6,944,066 B1 | 9/2005 | Jing | |
| 7,038,963 B2 | 5/2006 | Lee | |
| 7,075,368 B2 * | 7/2006 | Lin et al. | 330/254 |
| 7,154,331 B2 * | 12/2006 | Zaguri | 330/254 |
| 7,154,923 B2 | 12/2006 | Kucharski | |
| 7,218,166 B2 * | 5/2007 | Yanagisawa et al. | 327/538 |
| 7,262,638 B2 | 8/2007 | Shim | |
| 7,265,620 B2 * | 9/2007 | Liu et al. | 330/253 |
| 7,286,011 B2 * | 10/2007 | Chang et al. | 330/51 |
| 7,286,425 B2 | 10/2007 | Barth, Jr. | |
| 7,342,451 B2 | 3/2008 | Brueske | |
| 7,368,991 B2 * | 5/2008 | Swanson | 330/261 |
| 7,446,609 B2 | 11/2008 | Lee et al. | |
| 7,477,076 B2 | 1/2009 | Miyatake | |
| 7,521,992 B1 | 4/2009 | Hagleitner et al. | |
| 7,564,295 B2 | 7/2009 | Ker et al. | |
| 7,629,817 B2 | 12/2009 | Nedovic et al. | |
| 7,777,568 B2 | 8/2010 | Lim | |
| 7,786,764 B2 * | 8/2010 | Cheng | 327/72 |
| 7,813,199 B2 * | 10/2010 | Morgan | 365/205 |
| 7,889,006 B1 * | 2/2011 | Jones | 330/254 |
| 7,956,641 B1 * | 6/2011 | Peng et al. | 326/62 |
| 7,990,792 B2 | 8/2011 | Abe et al. | |
| 8,030,972 B2 * | 10/2011 | Jansson | 327/54 |
| 8,049,535 B2 | 11/2011 | Van Tran et al. | |
| 8,283,950 B2 * | 10/2012 | Willey | 327/103 |
| 8,289,796 B2 * | 10/2012 | Lee | 365/207 |
| 8,344,806 B1 * | 1/2013 | Franck et al. | 330/285 |
| 8,472,898 B2 * | 6/2013 | Rofougaran | 455/127.1 |
| 2003/0179842 A1 | 9/2003 | Kane et al. | |
| 2006/0220459 A1 * | 10/2006 | Kulasekeram | 307/11 |
| 2006/0273831 A1 | 12/2006 | Maksimovic et al. | |
| 2009/0267668 A1 | 10/2009 | Lin | |
| 2011/0182129 A1 | 7/2011 | Lee | |
| 2011/0235450 A1 * | 9/2011 | Lee et al. | 365/207 |
| 2012/0038405 A1 | 2/2012 | Willey | |
| 2012/0326786 A1 | 12/2012 | Willey | |
| 2013/0015899 A1 | 1/2013 | Willey | |
| 2013/0027133 A1 * | 1/2013 | Lee | 330/254 |

\* cited by examiner

US 8,659,965 B2

SENSE AMPLIFIER HAVING LOOP GAIN CONTROL

CROSS REFERENCE TO RELATED APPLICATION(S)

This application is a divisional of pending U.S. patent application Ser. No. 12/694,136, filed Jan. 26, 2010, which application is incorporated herein by reference, in its entirety, for any purpose.

TECHNICAL FIELD

Embodiments of the invention relate generally to integrated circuits, and more particularly, in one or more of the illustrated embodiments, to integrated circuit sense amplifiers.

BACKGROUND OF THE INVENTION

Current mode sense amplifiers (CSAs) have been used in integrated circuits to sense and amplify differential input currents. For example, in applications in semiconductor memory, the CSAs are often used to sense and amplify input currents resulting from reading memory cell data and being provided over long signal lines. As a result, the input currents are typically very weak and low in magnitude. In applications such as these, control of the CSA's loop gain is important because it affects the operating characteristics of the CSA. That is, where the loop gain of a CSA is approximately equal to 1, the dominant mode of operation for the CSA is sensing differential input currents. In contrast, as the loop gain of a CSA increases to be greater than 1, the dominant mode of operation for the CSA transitions from current sensing to behaving as a latch circuit. Thus, controlling loop gain is desirable in order to control the behavior of the CSA.

FIG. 1A illustrates a conventional current mode sense amplifier (CSA) 100. The CSA 100 includes a pair of cross coupled n-type metal-oxide-semiconductor (NMOS) transistors 102, 104 and diode coupled NMOS transistors 108, 110. NMOS bias transistors 112, 114 are coupled to the NMOS transistors 102, 104 and biased by a bias and voltage Vbias. Differential input currents are applied to the input-output nodes IO, IOb to be sensed and amplified by the CSA 100. As known, the loop gain of the CSA 100 is gmR, where gm is the transconductance of NMOS transistors 102, 104 and R is the load provided by the NMOS transistors 108, 110. As also known, the load for the diode coupled NMOS transistors 108, 110 is 1/gm. As a result, the loop gain for the CSA 100 is approximately 1, and the loop gain remains substantially constant despite variations in factors affecting gm, such as process, voltage, and temperature (PVT). Although the CSA 100 has the benefit of a being able to maintain a substantially constant loop gain for changes in PVT, for operation a supply voltage Vcc for the CSA 100 should be greater than the sum of the threshold voltages of the transistors 102 (or 104) and transistors 108 (or 110), and a voltage margin for operation. In low voltage, low power systems, however, providing a supply voltage of this level is not desirable.

FIG. 1B illustrates another conventional CSA 150. The CSA 150 includes cross coupled NMOS transistors 102, 104 and bias transistors 112, 114, as in the CSA 100. However, the diode coupled NMOS transistors 108, 110 of the CSA 100 have been replaced by p-channel metal-oxide-semiconductor (PMOS) transistors 158, 160 to provide load R. An advantage of the CSA 150 over the CSA 100 is that a Vcc can be less than that for CSA 100. The Vcc only needs to be greater than the threshold voltage of the transistors 102 (or 104) plus a voltage margin, which is one transistor threshold voltage less than for the CSA 100. As with CSA 100, the loop gain of the CSA 150 is gmR. In contrast to the diode coupled NMOS transistors 108, 110, the load provided by the PMOS transistors 158, 160 are not correlated with gm. As a result, the loop gain for the CSA 150 will vary more than the loop gain for the CSA 100 of FIG. 1 would vary with variations in PVT. As previously discussed, a greater variance of loop gain will cause the CSA's operating characteristics to vary greater with PVT as well, which is typically an undesirable situation.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
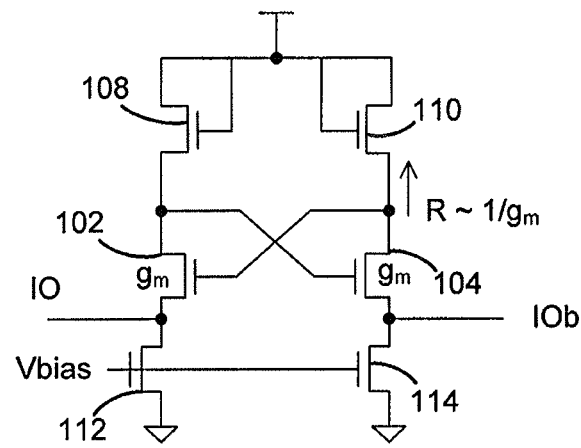
FIG. 1A is an example of a conventional current mode sense amplifier.
Figure 1B:
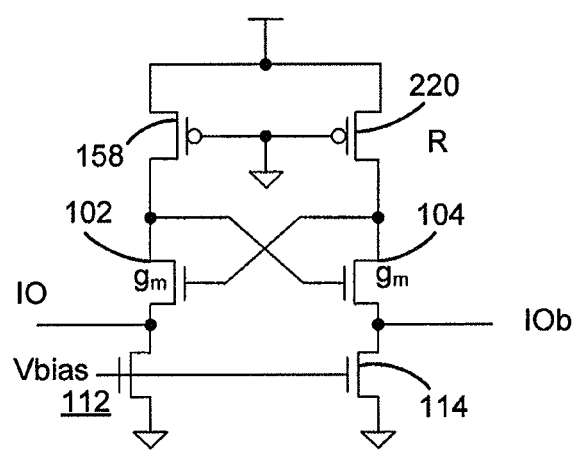
FIG. 1B is another example of a conventional current mode sense amplifier.
Figure 2:
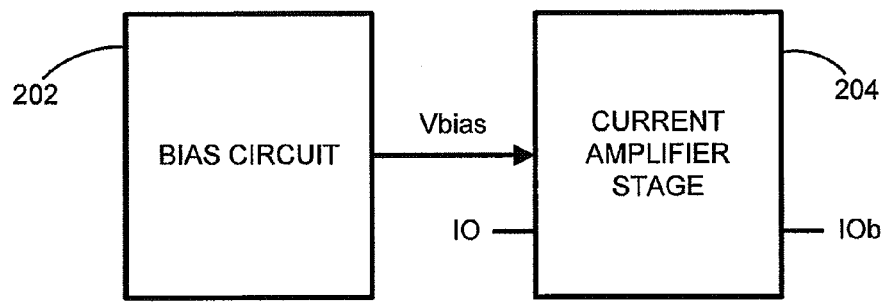
FIG. 2 is a current amplifier according to an embodiment of the invention.

FIG. 2 illustrates a sense amplifier 200 according to an embodiment of the invention. The sense amplifier includes a bias circuit 202 and an amplifier stage 204. In some embodiments, the bias circuit 202 is designed to have a substantially constant loop gain that is substantially resistant to variations in process, voltage, and/or temperature. A bias voltage Vbias generated by the bias circuit 202 adjusts to accommodate the constant loop gain. The bias circuit 202 provides the Vbias voltage to the amplifier stage 204, which is configured to sense input current and amplify the same at the input-output nodes IO, IOb. The loop gain of the amplifier stage 204 can be controlled at least in part by the Vbias voltage from the bias circuit 202, for example, to control the loop gain so that it is generally independent of process, voltage, and/or temperature variations. Additionally, operation of the amplifier stage 204 can be affected by changes to loop gain. For example, when the loop gain of the amplifier stage is approximately 1, the amplifier stage is sensitive to a current differential at the IO, IOb nodes. As the loop gain of the amplifier stage increases from 1, the behavior of the amplifier stage changes, having less sensitivity to an input current differential and behaving more as a latch circuit.

Figure 3:
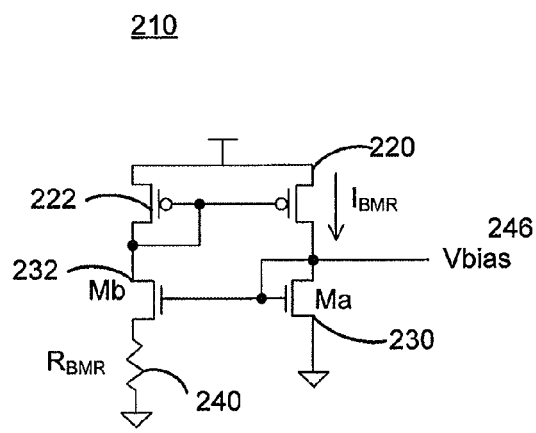
FIG. 3 is a bias circuit according to an embodiment of the invention.

A bias circuit 210 according to an embodiment of the invention is shown in FIG. 3. The bias circuit 210 may be used for the bias circuit 202 of the amplifier 200 of FIG. 2. The bias circuit 210 is an example of a beta multiplier reference (BMR) circuit. The bias circuit 210 includes a pair of transistors 220, 222, such as p-channel metal-oxide-semiconductor (PMOS) transistors, having gates coupled together and sources coupled to receive Vcc. The transistor 222 is coupled so that the gate is coupled to its drain. The bias circuit 210 further includes a pair of transistors 230, 232, such as n-channel metal-oxide semiconductor (NMOS) transistors having the respective gates coupled to each other. One of the transistors 230 has a gate coupled to its drain and a source coupled to a reference node, such as ground. A resistance 240 having a magnitude Rbmr is coupled to the source of the transistor 230 and the reference node. A bias voltage Vbias is provided from a node 246.

The loop gain for the bias circuit 210 (i.e., $gm_{230} \cdot R_{240}$), where $gm_{230}$ is the transconductance of transistor 230, is:

$$gm_{230} \cdot R_{240} = 2 \cdot \left(1 - \sqrt{\frac{(W/L)_{230}}{(W/L)_{232}}}\right)$$

As a result, the loop gain for the bias circuit 210 is constant (i.e., $gm_{230} \cdot R_{240} = 1$) for $$(W/L)_{232} = 4 \cdot (W/L)_{230}$$

With the transistors 230, 232 scaled accordingly, for example, (W/L) ratio for transistor 230 is four times the (W/L) ratio for transistor 232, the bias circuit 210 has a loop gain that is 1, and is substantially constant despite variations in process, voltage, and/or temperature. For example, where the resistance of the resistance 240 is lower due to variation in the fabrication process, the gm increases due to an increased current Ibmr resulting from the lower resistance, and likewise, the Vbias also related to Ibmr changes as well. As a result, the product of gm and R, that is, the loop gain for the bias circuit 210, is kept substantially despite the variation in R.

Figure 4:
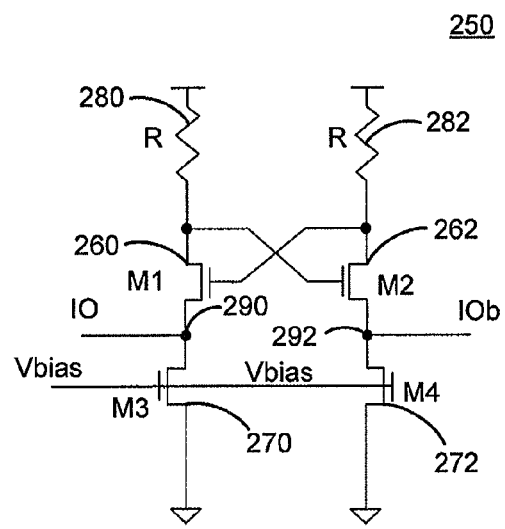
FIG. 4 is a current amplifier stage according to an embodiment of the invention.

An amplifier stage 250 according to an embodiment of the invention is illustrated in FIG. 4. The amplifier stage may be used for the amplifier stage 204 of the amplifier 200 of FIG. 2.

The amplifier stage 250 includes transistors 260, 262, such as n-channel metal-oxide-semiconductor (NMOS) transistors, having gates cross coupled to the drains of the other transistor. Transistors 270, 272 are coupled to sources of the transistors 260, 262, respectively, and have sources coupled to a reference node, such as ground. Gates of the transistors 270, 272 are coupled to receive a Vbias voltage from the bias circuit 202. Resistances 280, 282 having magnitudes R are coupled to drains of the transistors 260, 282, respectively, and coupled to receive Vcc. The amplifier stage 250 senses and amplifies current at input-output (IO) nodes IO, IOb 290, 292. As known, the loop gain for the amplifier stage 250 for matched transistors 260, 262 and matched resistances 280, 282 is:

$$gm_{260} \cdot R_{280} = gm_{262} \cdot R_{282}$$

Operation of the amplifier stage 250 will be described with the Vbias provided by the bias circuit 210 of FIG. 3. In some embodiments of the invention, the transistors 260, 262, 270, 272 of the amplifier stage 250 are matched to transistor 230 of the bias circuit. For example, the (W/L) ratio of transistors 260, 262, 270, 272 can be matched to that of transistor 230. Additionally, in some embodiments the resistances 280, 282 of the amplifier stage are the same magnitude as resistance 240 of the bias circuit. As a result of the matching of transistors 260, 262, 270, 272 to transistor 230 and matched resistance magnitude of resistances 280, 282 with resistance 240, the loop gain of the amplifier stage and the bias circuit are matched. For embodiments having the transistors of the bias circuit scaled to provide a loop gain of 1, for example, the (W/L) of transistor 232 is equal to four times the (W/L) of transistor 230, the loop gain of the amplifier stage 250 will be 1 as well.

With the transistors and resistances matched and Vbias provided to the amplifier stage 250 by a the matched bias circuit 210, the loop gain of the amplifier stage 250 will be generally independent of process, voltage, and/or temperature variations. For example, again considering the case where the resistance of the resistance 240 is lower due to variation in the fabrication process, the resistance of the resistances 280, 282 would also be lower since they were subjected to the same variation in the fabrication process. As previously discussed, the Vbias generated by the bias circuit 210 changes as a result of the change in Ibmr due to the lower resistance of the resistance 240. Turning to the amplifier stage, the Vbias voltage from the bias circuit 210 sets the transistors 270, 272 (which are matched to transistor 230 of the bias circuit 210) to the same bias condition of transistor 230. This in turn adjusts the bias current of the amplifier stage 250 in the same manner Ibmr of the bias circuit 210 was altered by the lower resistance of the resistance 240. As a result, the gm of the amplifier stage 250 will increase (as it did for the bias circuit 210) due to the increased bias current to compensate for the decreased R of resistances 280, 282 and the loop gain of the amplifier stage 250 remains substantially constant despite the variation in R. Generally the Vbias voltage can be used to change the bias current of the amplifier stage, which in turn changes the gm of the amplifier stage. As a result, the loop gain (i.e., gm·R) can be controlled by adjusting the Vbias voltage, for example, to be substantially constant.

In some embodiments, the transistors 260, 262, 270, 272 and resistances 280, 282 are not matched to transistors 230, 232 and resistance 240, as previously described. For example, transistors 260, 262 and transistors 270, 272 are designed (e.g., scaled) to provide transconductances k times the transconductance of transistor 230 of the bias circuit 210, and the magnitude of the resistances 280, 282 are (1/k) times the magnitude of resistance 240 of the bias circuit 210. Although the transistors are not matched, the amplifier stage 250 has a loop gain substantially equal to the loop gain of the bias circuit, that is, 1. In some embodiments, the transistors 260, 262, 270, 272 and resistances 280, 282 are designed to provide a amplifier stage having a loop gain other than 1. For example, where the loop gain of the amplifier stage 250 is greater than 1, the amplifier stage exhibits a latch circuit behavior.

Figure 5:
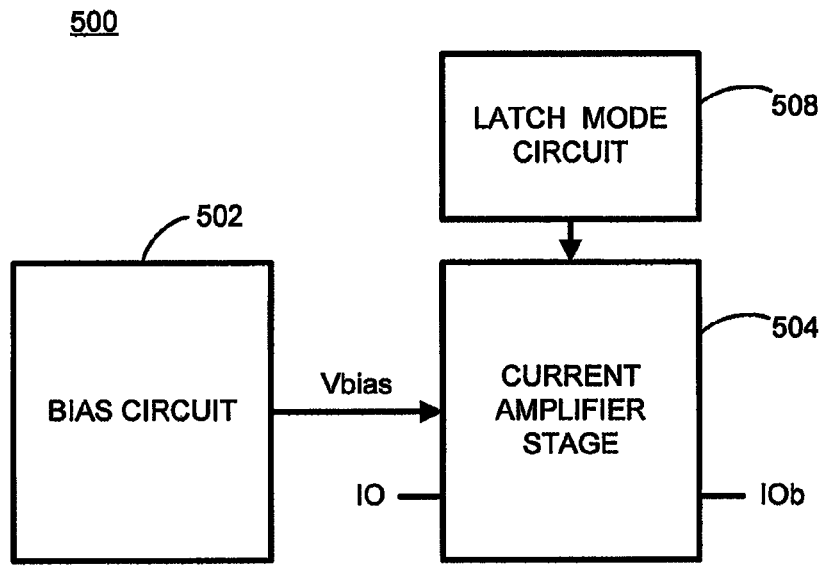
FIG. 5 is a current amplifier according to an embodiment of the invention.

FIG. 5 illustrates a sense amplifier 500 according to an embodiment of the invention. The sense amplifier 500 includes a bias circuit 502 configured to provide a bias voltage Vbias to an amplifier stage 504. The amplifier stage 504 senses input current and amplifies the same at input-output nodes IO, IOb. As with the bias circuit 502 of the sense amplifier 500, in some embodiments the bias circuit 502 provides a Vcc-independent Vbias signal. A loop gain of the sense amplifier 500 can be controlled at least in part by the Vbias voltage from the bias circuit 502, for example, to control the loop gain so that it is generally independent of process, voltage, and/or temperature variations. A latch mode circuit 508 is coupled to the amplifier stage 504 which when activated places the amplifier stage 504 into a latch mode (e.g., so that a sensed state of the amplifier stage 504 can be latched).

Figure 6:
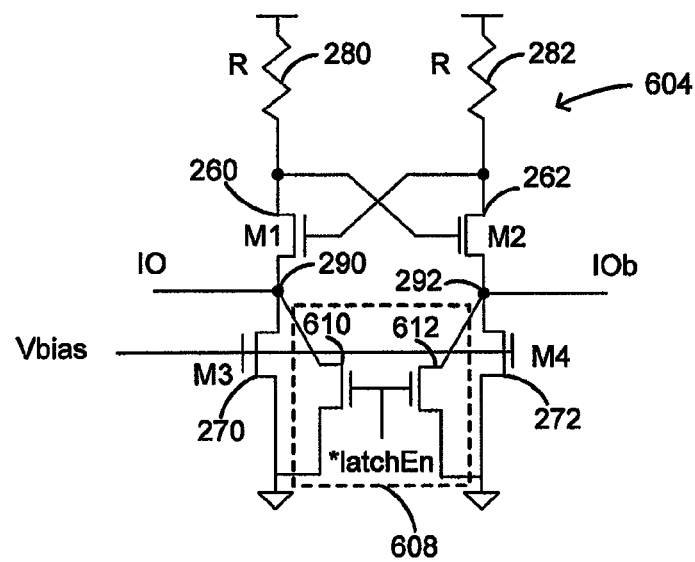
FIG. 6 is a current amplifier stage according to an embodiment of the invention.

FIG. 6 illustrates an amplifier stage and latch mode circuit 600 according to an embodiment of the invention. An amplifier stage 604 includes several components that are the same as the amplifier stage 250 shown in and described with reference to FIG. 4. The amplifier stage and latch mode circuit 600 further includes a latch mode circuit 608 that includes transistors 610, 612 that are coupled to IO nodes IO, IOb 290, 292, respectively, and a reference node, such as ground In operation, the amplifier stage 604 operates in the same manner as previously described with reference to the amplifier stage 250. However, in addition to sensing and amplifying the current as previously described, the latch mode circuit 608 can be activated by a latch mode enable signal latchEn to enable a "latch mode" of the amplifier stage 604 to latch a sensed state. In some embodiments, the latch mode circuit 608 is activated after initial current sensing by the amplifier stage 604. During activation, the transistors 610, 612 are conductive and couple IO nodes IO, IOb 290, 292 to the reference node to assist in amplifying an input differential. The bias current of the amplifier stage 604 increases due to the lower impedance created by activating transistors 610, 612, and consequently, increases the gm component of the loop gain for the amplifier stage 604. As a result, the overall loop gain of the amplifier stage 604 increases, and where the loop gain increases to be greater than 1, the amplifier stage 604 will behave in a manner similar to a latch circuit and the sensed state of the amplifier stage 604 can be latched.

Figure 7A:
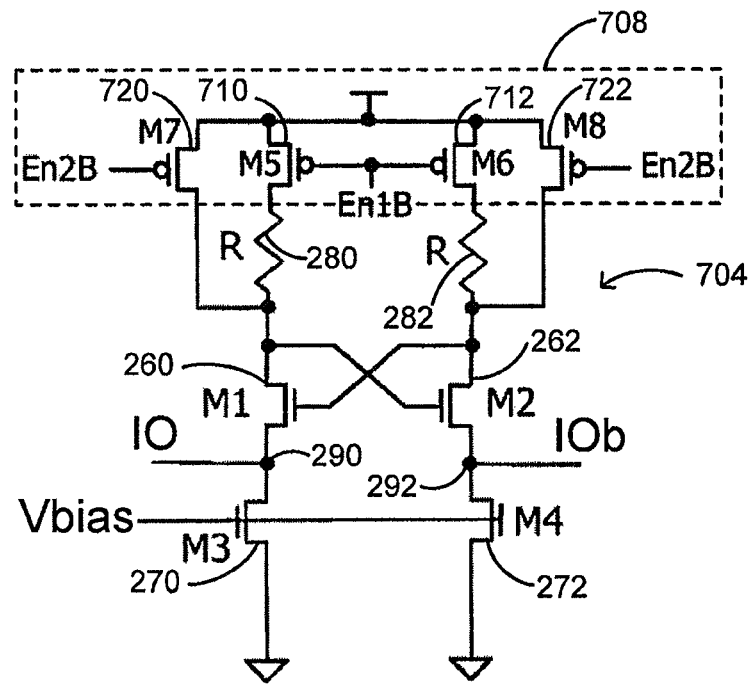
FIG. 7A is a current amplifier stage according to an embodiment of the invention.

FIG. 7A illustrates an amplifier stage and latch mode circuit 700 according to an embodiment of the invention. An amplifier stage 704 includes several components that are the same as the amplifier stage 250 shown in and described with reference to FIG. 4. The amplifier stage and latch mode circuit 700 further includes a latch mode circuit 708. The latch mode circuit 708 includes transistors 710, 712 coupled to resistances 280, 282, respectively, and supply voltage Vcc, and further includes transistors 720, 722 coupled to drains of transistors 260, 262, respectively, and Vcc. The transistors 710, 712 have dimensions such that the resistance when conductive is much smaller relative to the resistances 280, 282. The transistors 720, 722 have dimensions such that the resistance when conductive is larger relative to the resistances 280, 282. In some embodiments, (e.g., as shown in FIG. 7A) transistors 710, 712, 720, 722 are p-channel transistors, such as p-channel metal oxide semiconductor (PMOS) transistors. Transistors 710, 712 are activated responsive to enable signal En1b and transistors 720, 722 are activated responsive to enable signal En2b.

Figure 7B:
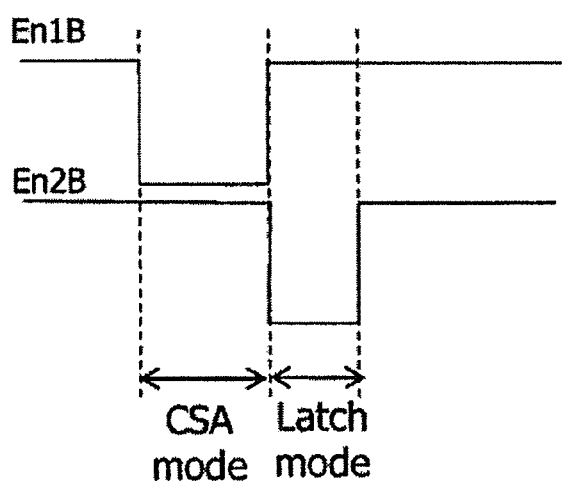
FIG. 7B is a signal diagram illustrating signals during operation of the current amplifier stage of FIG. 7A.

In operation, the amplifier stage 704 operates in the same manner as previously described with reference to the amplifier stage 250. However, the transistors 710, 712 are conductive during sensing and amplifying of current. The transistors 710, 712 are made conductive in response to an active enable signal En1b. To latch a sensed state of the amplifier stage, the transistors 710, 712 are deactivated (i.e., no longer conductive) and the transistors 720, 722 are activated by an active enable signal En2b. FIG. 7B illustrates the timing of the En1b and En2b signals according to an embodiment of the invention. With the transistors 720, 722 conductive and transistors 710, 712 non-conductive, the drains of the transistors 260, 262 are coupled to Vcc. The greater resistance (relative to resistances 280, 282) of transistors 720, 722 increases the R component of the loop gain for the amplifier stage 704. As a result, the overall loop gain of the amplifier stage 704 increases, and where the loop gain increases to be greater than 1, the amplifier stage 704 will behave in a manner similar to a latch circuit (i.e., putting the amplifier stage 704 into a "latch mode" of operation) and the sensed state of the amplifier stage 704 can be latched.

Figure 8:
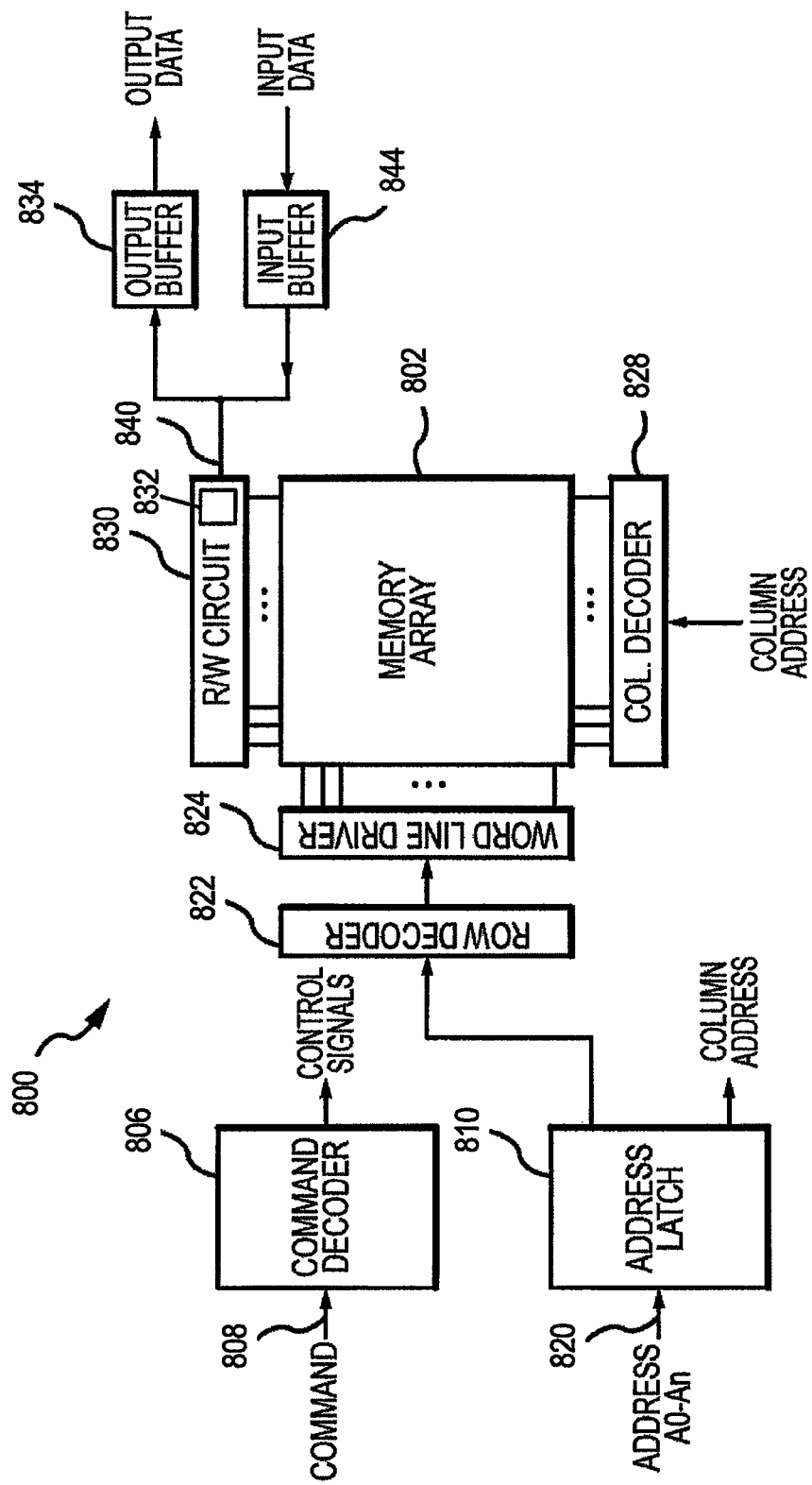
FIG. 8 is a block diagram of a memory including a current amplifier according to an embodiment of the invention.

FIG. 8 illustrates a portion of a memory 800 according to an embodiment of the present invention. The memory 800 includes an array 802 of memory cells, which may be, for example, DRAM memory cells, SRAM memory cells, flash memory cells, or some other types of memory cells. The memory 800 includes a command decoder 806 that receives memory commands through a command bus 808 and generates corresponding control signals within the memory 800 to carry out various operations. For example, the command decoder 806 responds to memory commands applied to the command bus 808 to perform various operations on the memory array 802. In particular, the command decoder 806 is used to generate internal control signals to read data from and write data to the memory array 802. Row and column address signals are applied to the memory 800 through an address bus 820 and provided to an address latch 810. The address latch then outputs a separate column address and a separate row address.

The row and column addresses are provided by the address latch 810 to a row address decoder 822 and a column address decoder 828, respectively. The column address decoder 828 selects bit lines extending through the array 802 corresponding to respective column addresses. The row address decoder 822 is connected to word line driver 824 that activates respective rows of memory cells in the array 802 corresponding to received row addresses. The selected data line (e.g., a bit line or bit lines) corresponding to a received column address are coupled to a read/write circuitry 830 to provide read data to a data output buffer 834 via an input-output data bus 840. Write data are applied to the memory array 802 through a data input buffer 844 and the memory array read/write circuitry 830. The read/write circuitry 830 includes at least one sense amplifier 832 according to an embodiment of the invention. Read data and write data provided to the read/write circuitry 830 is transmitted over input-output lines and are amplified by the sense amplifier 832 to be provided to the output buffer 834 and before being written to the memory array 802.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A sense amplifier, comprising:
   a bias circuit configured to provide a bias voltage and having a loop gain substantially equal to 1; and
   an amplifier stage coupled to the bias circuit to receive the bias voltage, the amplifier stage configured to sense a differential input at differential input-output nodes during a first mode and further configured to have an increased loop gain during a second mode to latch a sensed state.

2. The sense amplifier of claim 1 wherein the bias circuit comprises a pair of transistors having gates coupled together, one of the transistors having the gate coupled to its drain and having transistor dimensions four times the transistor dimensions of the other transistor.

3. The sense amplifier of claim 1 wherein the amplifier stage has a loop gain substantially equal to 1 during the first mode.

4. The sense amplifier of claim 1 wherein the amplifier stage and bias circuit each have at least one transistor that are matched and at least one resistance that are matched.

5. The sense amplifier of claim 1 wherein the bias circuit comprises a resistance having a magnitude and wherein the amplifier stage comprises at least one resistance having a magnitude equal to the magnitude of the resistance of the bias circuit.

6. The sense amplifier of claim 1 wherein the bias circuit comprises a transistor having a gate and a drain coupled to a bias voltage output node from which the bias voltage is provided, and wherein the amplifier stage includes at least one transistor coupled to one of the differential input-output nodes having transistor dimensions substantially the same as the transistor dimensions for the transistor of the bias circuit.

7. The sense amplifier of claim 1 wherein the amplifier stage comprises a latch mode circuit configured to increase the loop gain of the amplifier stage when activated.

8. The sense amplifier of claim 7 wherein the latch mode circuit is configured to be activated following sensing of the differential input at the differential input-output nodes.

9. The sense amplifier of claim 7 wherein the latch mode circuit comprises a transistor coupled to one of the differential input-output nodes and a reference node, the transistor made conductive responsive to a latch enable signal.

10. The sense amplifier of claim 7 wherein the latch mode circuit comprises a first transistor coupled to a resistance of the amplifier stage and configured to be coupled to a supply voltage and a second transistor configured to be coupled to the supply voltage and the resistance, the first transistor configured to couple the resistance to the supply voltage responsive to a first latch enable signal and the second transistor configured to bypass the resistance responsive to a second latch enable signal, the second transistor having a resistance greater than a resistance of the resistance.

11. A method for amplifying a differential input, comprising:
   sensing a differential input at differential input-output nodes of a differential amplifier;
   amplifying the sensed differential input; and
   increasing a loop gain of the differential amplifier to latch a sensed state by decoupling a first resistance of the differential amplifier and enabling a second resistance having a resistance magnitude greater than the first resistance.

12. The method of claim 11 wherein sensing a differential input comprises sensing a differential current input at the differential input-output nodes.

13. The method of claim 11 wherein increasing the loop gain of the differential amplifier comprises increases a resistance of the differential amplifier.

* * * * *